United States Patent
Shen et al.

(10) Patent No.: US 8,453,037 B2
(45) Date of Patent: May 28, 2013

(54) TURBO CODING HAVING COMBINED TURBO DE-PADDING AND RATE MATCHING DE-PADDING

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/296,348

(22) Filed: Nov. 15, 2011

(65) Prior Publication Data

US 2012/0063537 A1    Mar. 15, 2012

Related U.S. Application Data

(63) Continuation of application No. 12/111,863, filed on Apr. 29, 2008, now Pat. No. 8,069,387.

(60) Provisional application No. 60/950,084, filed on Jul. 16, 2007.

(51) Int. Cl.
*H03M 13/00* (2006.01)

(52) U.S. Cl.
USPC .......................................... 714/776; 714/774

(58) Field of Classification Search
USPC .................................................. 714/776, 774
See application file for complete search history.

(56) References Cited

U.S. PATENT DOCUMENTS

| | | | |
|---|---|---|---|
| 7,219,293 B2 * | 5/2007 | Tsai et al. | 714/757 |
| 7,301,482 B1 * | 11/2007 | Oberg | 341/58 |
| 2005/0010719 A1 * | 1/2005 | Slavin | 711/108 |
| 2005/0055500 A1 * | 3/2005 | Park | 711/112 |

* cited by examiner

*Primary Examiner* — M. Mujtaba K Chaudry
(74) *Attorney, Agent, or Firm* — Garlick & Markison; Shayne X. Short

(57) ABSTRACT

Turbo coding having combined turbo de-padding and rate matching de-padding. An approach is presented by which a singular module is operable to perform both zero bit de-padding and dummy bit de-padding in accordance with turbo encoding. Zero padding can be performed on an input information stream before undergoing turbo encoding. One or more of the 3 outputs from the turbo encoding module (e.g., systematic bits, parity 1 bits, and parity 2 bits) may then undergo dummy bit padding as well. Thereafter, these 3 streams (some or all of which may have undergone dummy bit padding) undergo sub-block interleaving. After all of these operations have taken place, a singular combined de-padding module that can be employed to perform de-padding any zero padded bits and any dummy padded bits from each of the three streams that have undergone the sub-block interleaving.

20 Claims, 11 Drawing Sheets

US 8,453,037 B2

TURBO CODING HAVING COMBINED TURBO DE-PADDING AND RATE MATCHING DE-PADDING

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 12/111,863, entitled "Turbo coding having combined turbo de-padding and rate matching de-padding,", filed Apr. 29, 2008, pending, and scheduled to be issued as U.S. Pat. No. 8,069,387 on Nov. 29, 2011 (as indicated in an ISSUE NOTIFICATION mailed on Nov. 9, 2011), which claims priority pursuant to 35 U.S.C. §119(e) to the following U.S. Provisional Patent Application which is hereby incorporated herein by reference in its entirety and made part of the present U.S. Utility patent application for all purposes:

a. U.S. Provisional Application Ser. No. 60/950,084, entitled "Turbo coding having combined turbo de-padding and rate matching de-padding,", filed Jul. 16, 2007, now expired.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

In fact, as the throughput requirement in communication systems increases, parallel turbo decoding, which employs a plurality of processors and a plurality of memory banks, become necessary. Many of the current systems support a wide range of codeword sizes. Thus, efficiency and flexibility in parallel turbo decoder design is of critical importance.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Many communication systems incorporate the use of a turbo code. While there are many potential applications that can employ turbo codes, means are presented herein that can be applied to the 3GPP channel code to support an arbitrary number of information bits. Some examples of the number of bits, though not limited thereto, that can be supported using the various aspects of the invention presented herein are 40 to 5114 for WCDMA and HSDPA and more for LTE. Alternatively, other examples of the number of bits, though not limited thereto, that can be supported using the various aspects of the invention presented herein are 40 to 6114 or 40 to 8192, or any other desirable number of bits as selected for a particular application.

Additional information regarding the UTRA-UTRAN Long Term Evolution (LTE) and 3GPP System Architecture Evolution (SAE) can be found at the following Internet web site:

www.3gpp.org

Turbo coding was suggested for 3GPP LTE channel coding. Within the channel coding system in 3GPP LTE, there is a need and desire to supply and provide for a wide range of block sizes (i.e., turbo code block lengths). For this coding system, the algebraic interleave referred to as the "almost regular permutation (ARP)" in reference [1] is considered as one of the candidates, and "quadratic polynomial permutation (QPP)" in reference [2] is considered as an alternative candidate.

Furthermore, the turbo decoding of this system generally needs to be implemented using a parallel decoding arrangement because of the very high data throughput and large block size desired for 3GPP LTE channel coding. The parallel decoding requires the collision-free memory accessing (i.e., any one turbo decoder (of a group of parallel arranged turbo decoders) accesses only memory (of a group of parallel arranged memories) at any given time).

In reference [3], 188 different set of coefficients are proposed to support about 6,000 different block sizes. Using the list in reference [3], in the worst case 128 dummy bits need to be added for marching the nearest QPP interleave according to the approach presented therein.

In accordance with certain aspects of the invention, a much smaller QPP coefficients list can be employed which also provides significantly more flexible granularity that the approach in reference [3]. This allows for much fewer dummy bits, if any, that need to be employed to effectuate all of a large number of required interleaves ($\pi$) to support a wide variety of turbo codes.

Figure 1:
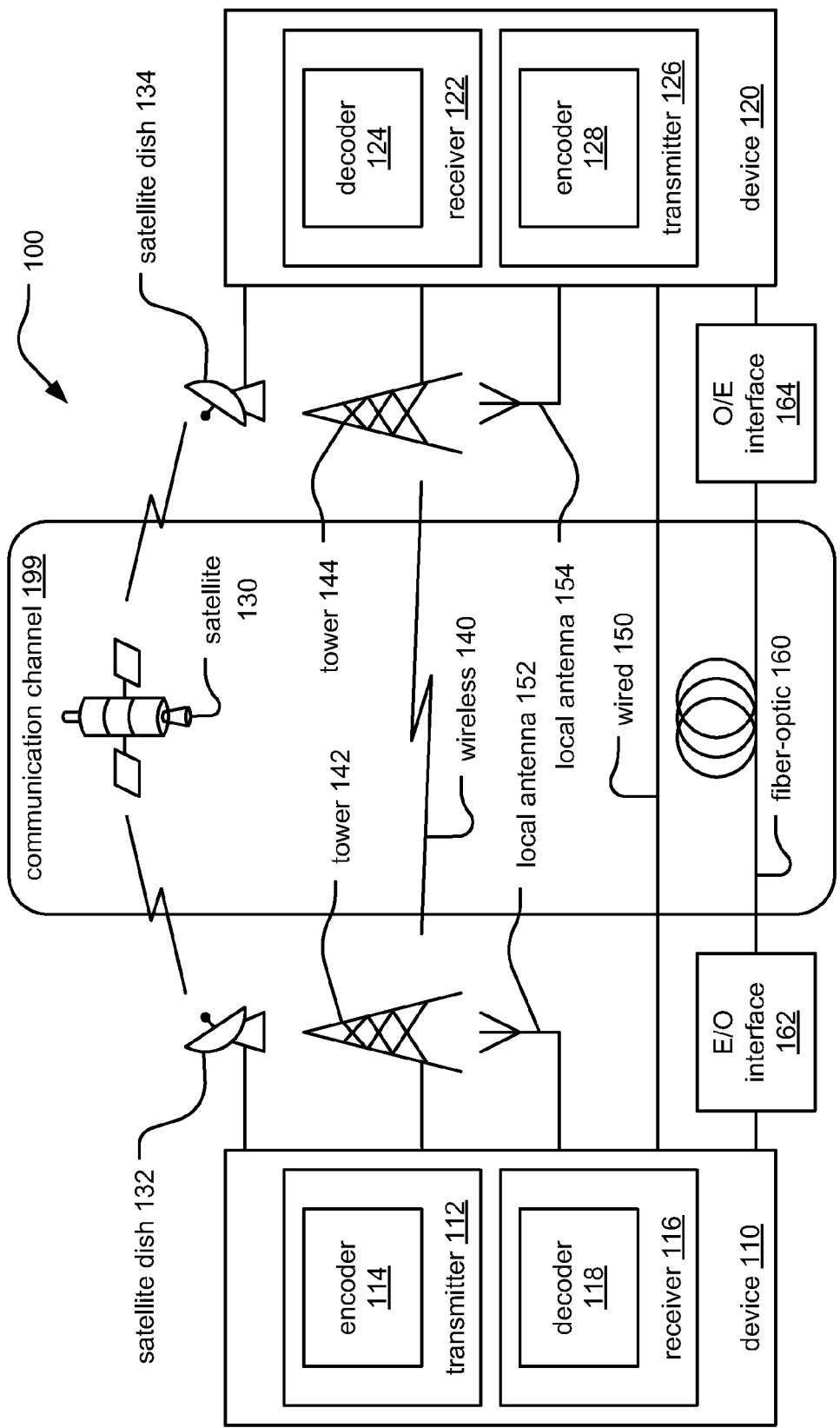
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Figure 2:
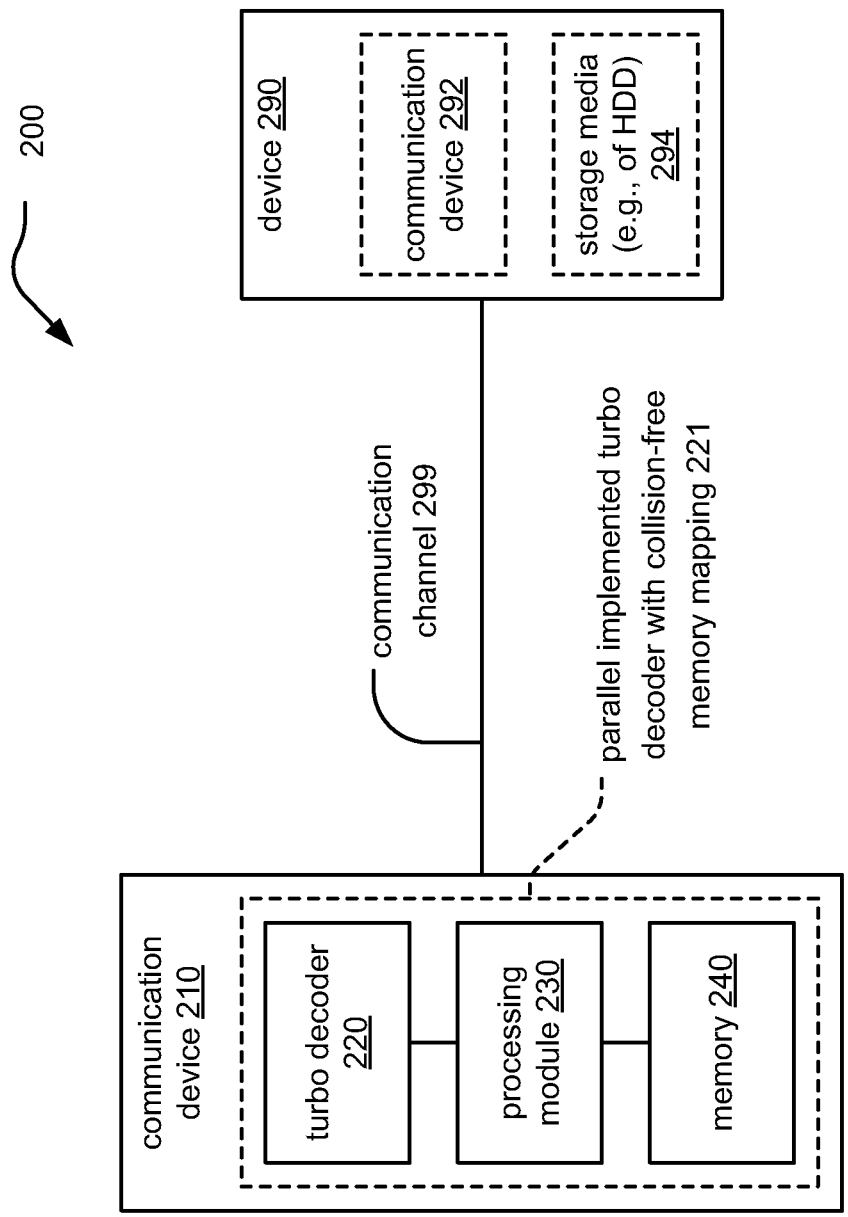
FIG. 2 illustrates an alternative embodiment of a communication system.

FIG. 2 illustrates an alternative embodiment of a communication system 200.

Referring to the communication system 200 of FIG. 2, the communication system 200 includes a communication device 210 that is coupled to another device 290 via a communication channel 299. The communication device 210 includes a decoder 221 that is implemented as a parallel implemented turbo decoder that is operable to employ collision-free memory mapping.

The other device 290 to which the communication device 210 is coupled via the communication channel 299 can be another communication device 292, a storage media 294 (e.g., such as within the context of a hard disk drive (HDD)), or any other type of device that is capable to receive and/or transmit signals. In some embodiments, the communication channel 299 is a bi-directional communication channel that is operable to perform transmission of a first signal during a first time and receiving of a second signal during a second time. If desired, full duplex communication may also be employed, in which each of the communication device 210 and the device 290 can be transmitted and/or receiving from one another simultaneously.

The decoder 221 of the communication device 210 includes a turbo decoder 220, a processing module 230, and a memory 240. The processing module 230 can be coupled to the memory 240 so that the memory is operable to store operational instructions that enable to the processing module 230 to perform certain functions.

Generally speaking, the processing module 230 is operable to perform collision-free memory mapping between the turbo decoder 220 and the memory 240 during iterative decoding processing.

It is also noted that the processing module 230, as well as any other processing module described herein, can be implemented in any number of ways as described below. In one embodiment, the processing module 230 can be implemented strictly as circuitry. Alternatively, the processing module 230 can be implemented strictly in software such as can be employed within a digital signal processor (DSP) or similar type device. In even another embodiment, the processing module 230 can be implemented as a combination of hardware and software as well without departing from the scope and spirit of the invention.

In even other embodiments, the processing module 230 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module 230 can be coupled to the memory 240 that is operable to store operational instructions that enable to processing module 230 to perform the appropriate collision-free memory mapping between the turbo decoder 220 and the memory 240.

Such a memory 240 may be a single memory device or a plurality of memory devices. Such a memory 240 may be a read-only memory, random access memory, volatile memory, non-volatile memory, static memory, dynamic memory, flash memory, and/or any device that stores digital information. Note that when the processing module 230 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Figure 3:
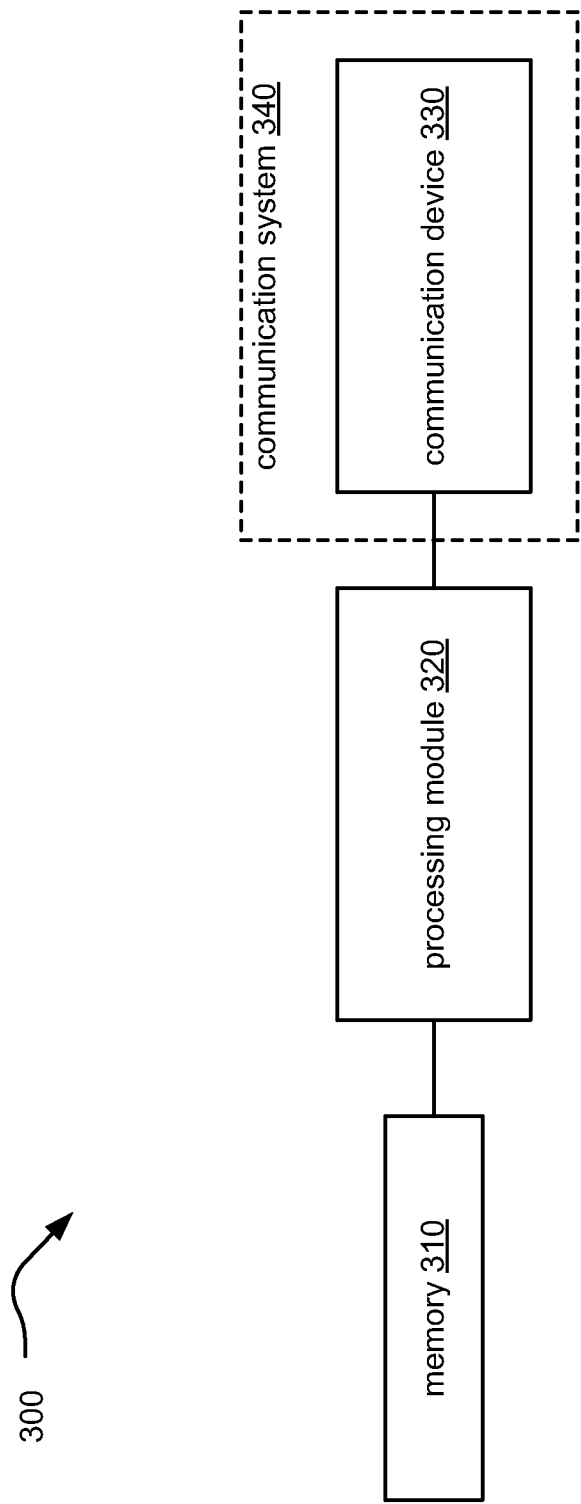
FIG. 3 illustrates an embodiment of an apparatus that is operable to perform turbo coding.

FIG. 3 illustrates an embodiment of an apparatus that is operable to perform turbo coding. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which turbo coding is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the turbo coding is to be performed (e.g., the portion, module, and/or functional block that is moved from a check engine into a bit engine) can be provided from the apparatus 300 to a communication system 340 that is operable to employ and perform turbo coding using a desired turbo coding or implementation thereof. For example, information corresponding to the turbo code being used (e.g., the code rate, constituent encoders employed, any puncturing, padding, de-padding, etc.) can also be provided from the processing module 320 to any of a variety of communication devices 330 implemented within the communication system 340 as well. In addition, the manner in which such turbo coding is to be performed within any of a variety of communication devices 330 implemented within the communication system 340 can also be provided from the processing module 320.

If desired, the apparatus 320 can be designed to generate multiple means of performing turbo coding in accordance with multiple needs and/or desires as well. In some embodiments, the processing module 320 can selectively provide different information (e.g., corresponding to different turbo codes, etc.) to different communication devices and/or communication systems. That way, different communication links between different communication devices can employ different turbo codes and/or means by which to perform turbo coding. Clearly, the processing module 320 can also provide the same information to each of different communication devices and/or communication systems as well without departing from the scope and spirit of the invention.

Figure 4:
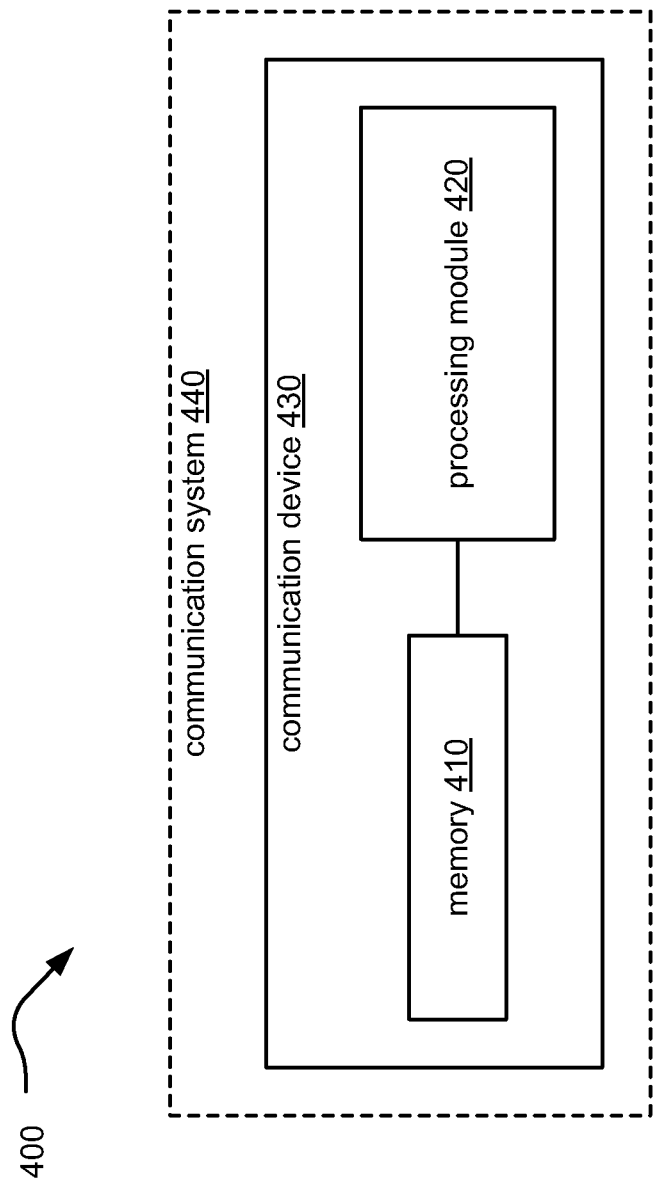
FIG. 4 illustrates an alternative embodiment of an apparatus that is operable to perform turbo coding.

FIG. 4 illustrates an alternative embodiment of an apparatus 400 that is operable to perform turbo coding. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which turbo coding is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of turbo coding as presented herein, and equivalents thereof, may be applied to many types of communication systems and/or communication devices.

Figure 5:
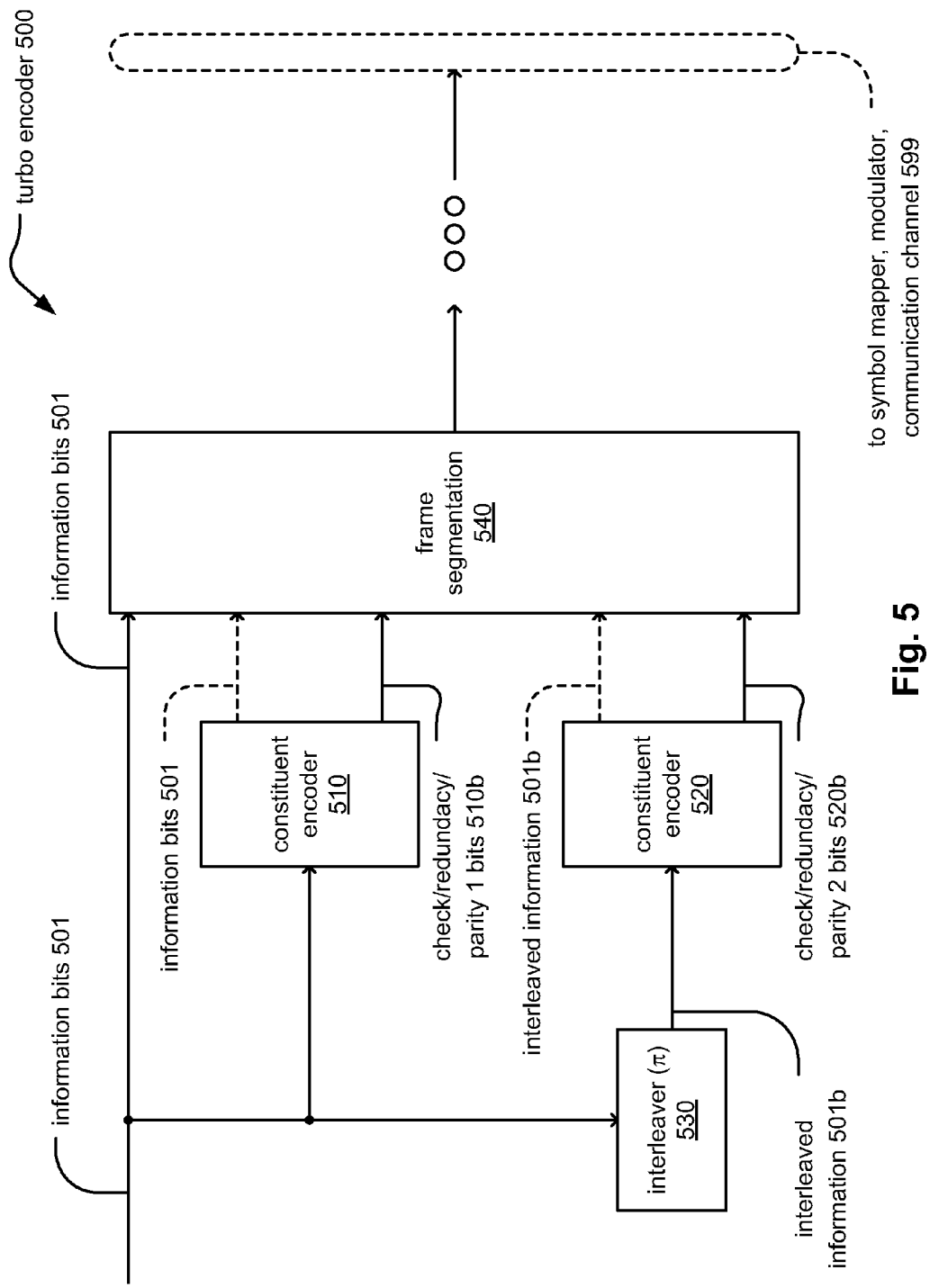
FIG. 5 and FIG. 6 illustrate embodiment of turbo encoding modules.
Figure 6:
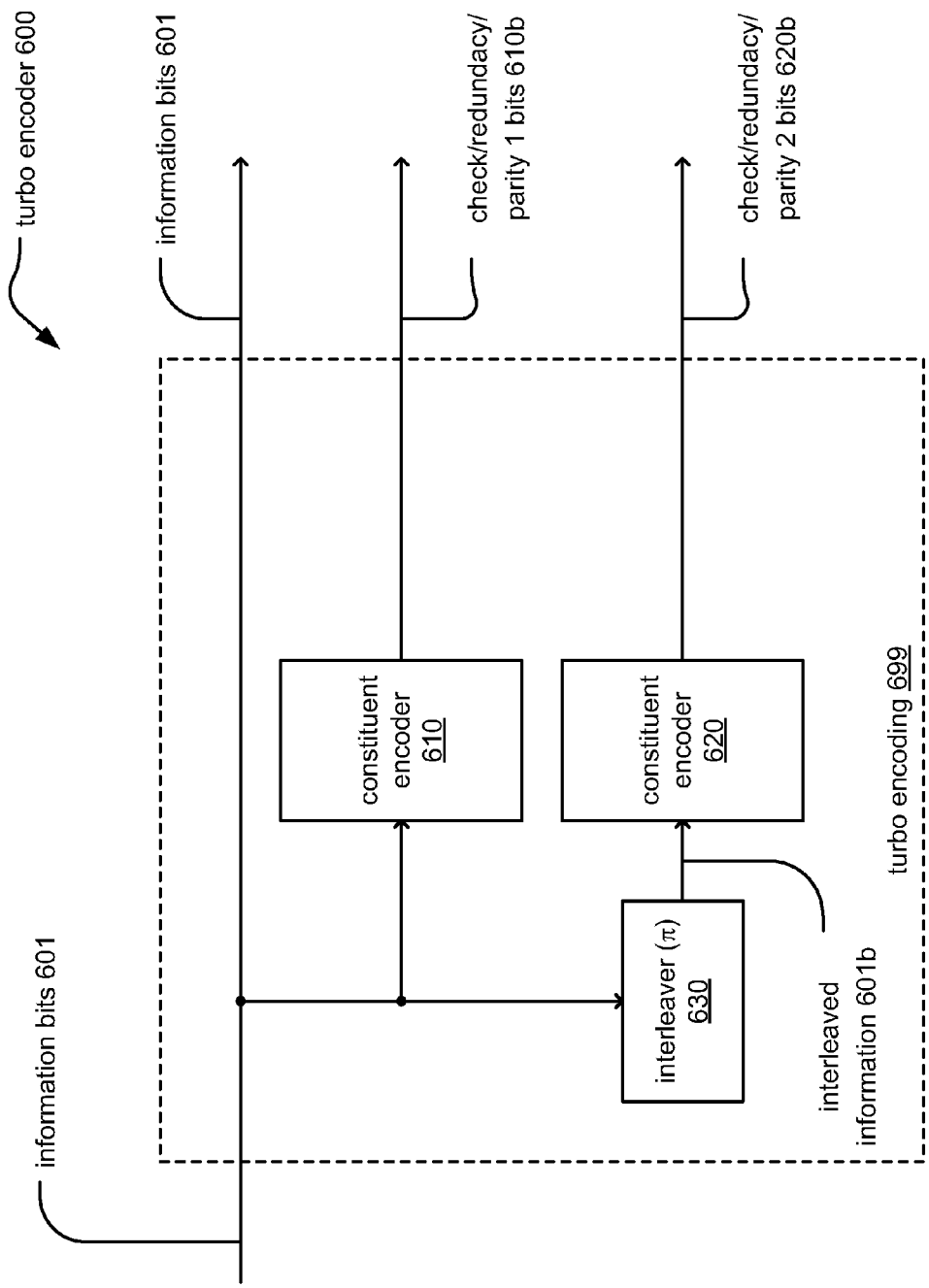

FIG. 5 and FIG. 6 illustrate embodiment of turbo encoding modules.

FIG. 5 illustrates an embodiment of a turbo encoding module 500. Information bits are provided to an interleaver ($\pi$) module 530 that is operable to generate interleaved information 501b. The interleave ($\pi$) employed by the interleaver ($\pi$) module 530 can be a QPP interleave ($\pi$) in some embodiments. Alternatively, other desired interleaves ($\pi$) can be employed by the interleaver ($\pi$) module 530 without departing from the scope and spirit of the invention.

These information bits 501 are also passed to a first constituent encoder 510 from which both the information bits 501 as well as check/redundancy/parity 1 bits 510b are output there from. Both these bits streams (501 and 510b) may be augmented with termination bits, which are used to return the respective constituent encoder to a known state after each turbo block is encoded.

The interleaved information 501b output from the interleaver (t) module 530 is also passed to a second constituent encoder 520 from which both the interleaved information 501b as well as check/redundancy/parity 2 bits 520b are output there from. Similarly as described above, these bits streams (501b and 520b) may be augmented with termination bits, which are used to return the respective constituent encoder to a known state after each turbo block is encoded.

In the art, the parity bits output from a turbo encoder are sometimes referred to as check bits, parity bits, and/or redundancy bits. Moreover, the information bits output from a turbo encoder are sometimes referred to as the information bits (i.e., the very same as was provided to the turbo encoder) and also as systematic bits (e.g., in the context of a systematic encoder that, when encoding information bits, outputs those same information bits as well as check/redundancy/parity bits). Herein, parity bits are oftentimes employed for reference to these check/redundancy/parity bits output from a turbo encoder, and information bits is oftentimes employed for reference to these information/systematic bits output from a turbo encoder.

Each of the information bits 501, the parity 1 bits 510b, and the parity 2 bits 520b is provided to a frame segmentation module 540. Various other components can also be situated as part of or after the frame segmentation module 540 to assist in the generation of an encoded block that may then be passed to a symbol mapper where the symbols are mapped according to the appropriate modulation (constellation and mapping). These symbol mapped symbols may then undergo any appropriate modulation as required to generate a continuous-time signal whose format comports with a communication channel into which the turbo coded signal is to be launched.

FIG. 6 illustrates an embodiment of a turbo encoding module 600. Information bits are provided to an interleaver ($\pi$) module 630 that is operable to generate interleaved information 601b. The interleave ($\pi$) employed by the interleaver ($\pi$) module 630 can be a QPP interleave ($\pi$) in some embodiments. Alternatively, other desired interleaves ($\pi$) can be employed by the interleaver ($\pi$) module 630 without departing from the scope and spirit of the invention.

These information bits 601 are also passed to a first constituent encoder 610 from which both the information bits 601 as well as check/redundancy/parity 1 bits 610b are output there from. Both these bits streams (601 and 610b) may be augmented with termination bits, which are used to return the respective constituent encoder to a known state after each turbo block is encoded.

The interleaved information 601b output from the interleaver ($\pi$) module 630 is also passed to a second constituent encoder 620 from which both the interleaved information 601b as well as check/redundancy/parity 2 bits 620b are output there from. Similarly as described above, these bits streams (601b and 620b) may be augmented with termination bits, which are used to return the respective constituent encoder to a known state after each turbo block is encoded.

Many subsequent embodiments also depict variations of turbo encoding. The module depicted as turbo encoding module 699 can be viewed as performing analogous functionality within these diagrams, in that, information bits 601 are provided thereto, and the turbo encoding module 699 outputs the information bits 601, the check/redundancy/parity 1 bits 610b, and the check/redundancy/parity 2 bits 620b there from. Several of these subsequent embodiments also depict a turbo encoding module having a single input (e.g., information bits 601 in FIG. 6) and three outputs (e.g., the information bits 601, the check/redundancy/parity 1 bits 610b, and the check/redundancy/parity 2 bits 620b in FIG. 6); this diagram of FIG. 6 can be used to interpret those subsequent diagrams.

Figure 7:
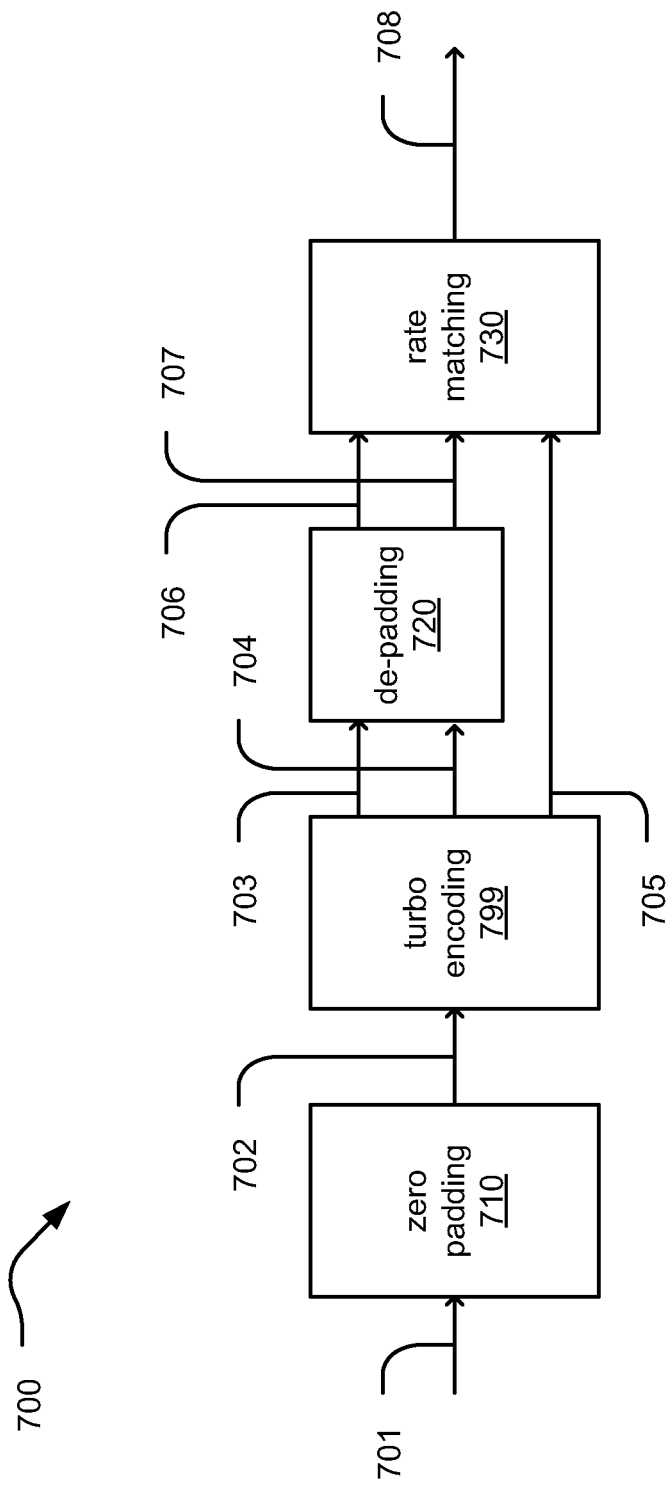
FIG. 7 illustrates an embodiment of de-padding for turbo encoding.

FIG. 7 illustrates an embodiment of de-padding for turbo encoding 700. The 188 QPP interleaves were adopted as turbo code interleaves for 3GPP LTE (e.g., see reference [4]). It is decided that the information block sizes LTE has to support are any integers from 40 to 6144. Thus, when the information block size is not the size of one of 188 QPP interleaves (e.g., see reference [4]), then one or more 0 bits has/have to be padded at the beginning of the block. It was then decided (e.g., see reference [5]) that, after encoding, those padded bits shall be de-padded from the systematic sequence (e.g., the information bits output from a turbo encoding module) and parity bit sequence from the (top) constituent encoder that encodes the un-interleaved information sequence (e.g., these are the check/redundancy/parity 1 bits output from a turbo encoding module).

An information sequence (701 in FIG. 7) of length M is provided to a zero padding module 710, the output of which, 702, is of length B. In one embodiment, this length B is one of the supported sizes of the QPP interleaves (e.g., in accordance with one of the supported QPP interleave block sizes employed for 3GPP LTE (e.g., see reference [4])).

Thus, $L_0=B-M$ zeros are padded in front of the input stream. The zero padded stream 702 is then provided for turbo encoding in turbo encoding module 799. The outputs of the turbo encoding module 799 include 3 streams, shown as 703 (the systematic bits), 704 (the first parity bits output from a first constituent encoder), and 705 (the second parity bits output from a second constituent encoder). Each of these streams is of length $K=B+T$, where T is the number of termination bits (e.g., as described above to return the respective constituent encoder to a known state after each turbo block is encoded).

The streams depicted as 703 and 704 are provided to a de-padding module 720, which removes the $L_0$ leading zeros from each stream to generate two streams shown as 706 and 707, each being of length M+T. These two streams (706 and 707) and stream 705 are provided to a rate matching module 730, the output of which is shown as 708.

Figure 8:
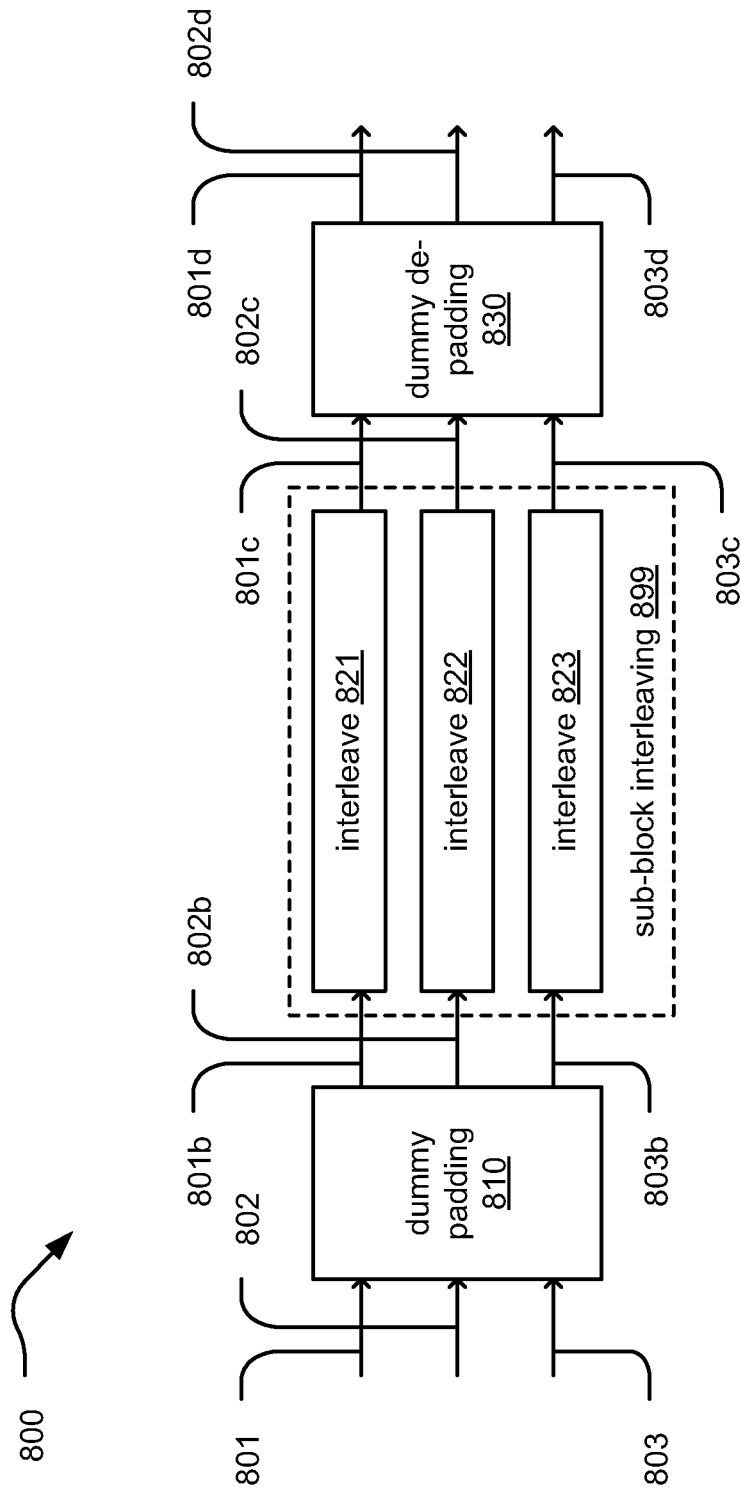
FIG. 8 illustrates an embodiment of de-padding for circular buffer rate matching (CBRM).

FIG. 8 illustrates an embodiment of de-padding for circular buffer rate matching (CBRM) 800. The circular buffer rate matching (CBRM) was adopted as channel rate matching 3GPP LTE (e.g., see reference [4]). In CBRM, three sub-block interleaves are applied to interleave systematic bit stream, parity 1 stream (parity bits from top constituent encoder) and parity 2 stream (from bottom constituent encoder). The interleaves are rectangular interleaves with 32 columns with column permutation [1]. Since the size of stream sent to interleave may not be a multiple of 32, Dummy bits shall be padded before the sent stream to make the size of multiple of 32. Before the interleaved sequence is sent out the dummy bits shall be de-padded.

Three input streams (shown as 801, 802, and 803) are provided to a dummy padding module 810. From certain perspectives, these three streams can be viewed as being provided from a turbo encoder (e.g., 801 being the systematic bits, 802 being parity bits from a top constituent encoder, and 803 being parity bits from a bottom constituent encoder).

For any one of the three streams (801, 802, and 803), let K be its length and R be the smallest integer such that $K \leq 32R$. Then, $N_D=32R-K$ dummy bits must be padded to the front of the stream before it can be provided to the corresponding sub-block interleaving module (821, 822, or 823).

After undergoing dummy padding in the dummy padding module 810, the three input streams (801, 802, and 803) are processed and output from the dummy padding module 810 as three dummy padded streams (801b, 802b, and 803b), each of which is provided to a sub-block interleaving module 899. The sub-block interleaving module 899 performs three interleaves 821, 822, and 823 to each of the three streams 801b, 802b, and 803b, respectively. It is noted that each of the three interleaves 821, 822, and 823 may employ separate and distinct interleaves (e.g., they need not all be the same three interleave).

The sub-block interleaving module 899 is selectively operable to perform any one of (1) the same interleaving to each of the three streams (801b, 802b, and 803b), (2) different interleaving to each of the three streams (801b, 802b, and 803b), and/or (3) any combination thereof (e.g., perform the same interleaving to two of the three streams and a different interleaving to the third of the three streams, etc.). Again, in other words, each of the interleaves 821, 822, and 823 may be the same interleave, they may all be different, or two of them may be the same interleave with the third of them being different.

The three output streams (801c, 802c, and 803c) of the sub-block interleaving module 899, are provided to a dummy de-padding module 830, which removes the dummy padded bits and output them as three output streams 801d, 802d, and 803d, each being of length K.

Figure 9:
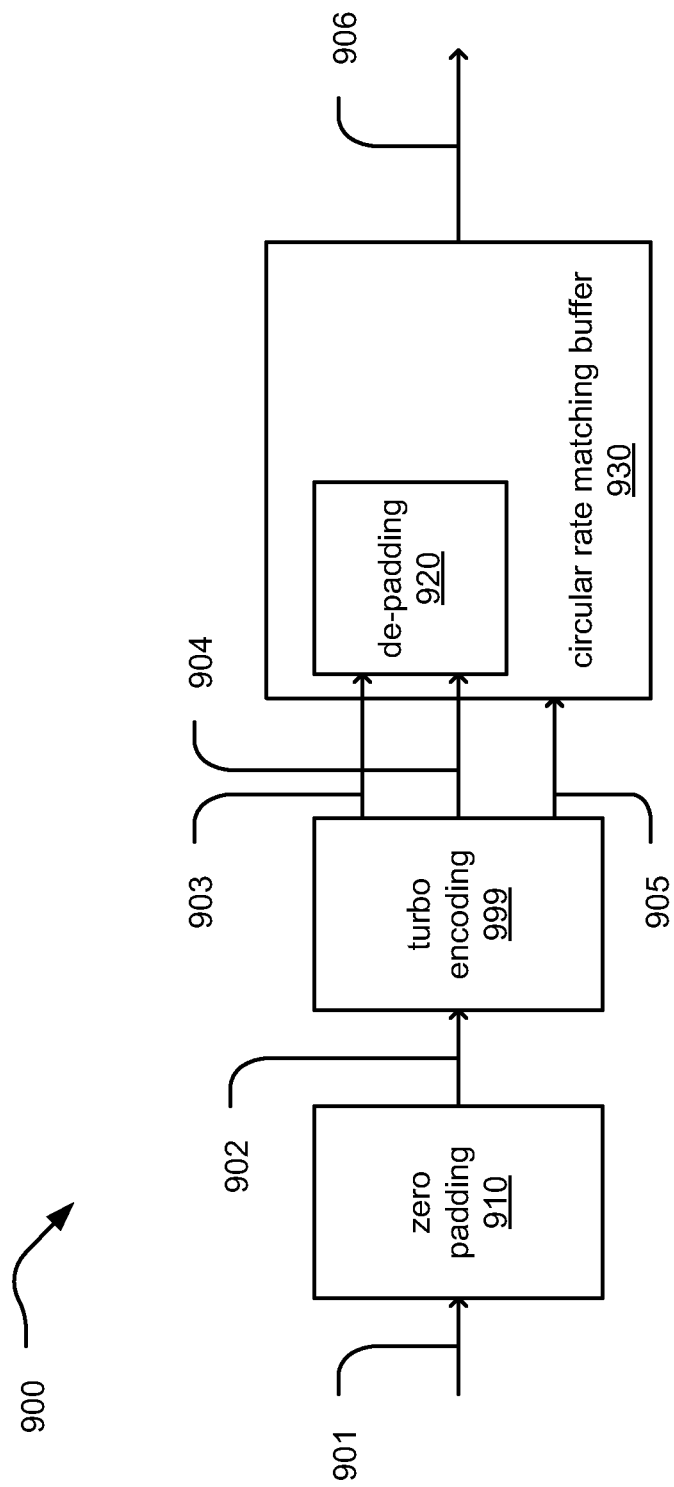
FIG. 9 illustrates an embodiment of combined turbo de-padding and CBRM.

FIG. 9 illustrates an embodiment of combined turbo de-padding and CBRM 800. In reference [6], this approach of FIG. 9 for combining turbo interleave de-padding and CBRM was proposed. However, the approach in reference [6] fails to provide for any sub-block de-padding. In contradistinction, the novel approach presented herein employs a singular combined de-padding module that can be employed to perform de-padding any zero padded bits and any dummy padded bits from each of the three streams that have undergone the sub-block interleaving.

An input stream (shown as 901) is provided to a zero padding module 910. A zero padded sequence, 902, is output from the zero padding module 910 and provided to a turbo encoding module 999, from which 3 streams are output, shown as 903 (the systematic bits), 904 (the first parity bits output from a first constituent encoder), and 905 (the second parity bits output from a second constituent encoder).

Streams 903 (the systematic bits) and 904 (the first parity bits output from a first constituent encoder) are provided to a de-padding module 920 implemented within a circular rate matching buffer 930. As can be seen, any de-padding that is inherently performed in accordance with rate matching (e.g., within the de-padding module 920) is integrated into the circular rate matching buffer 930. In other words, the circular rate matching buffer 930 include de-padding capability therein.

Figure 10:
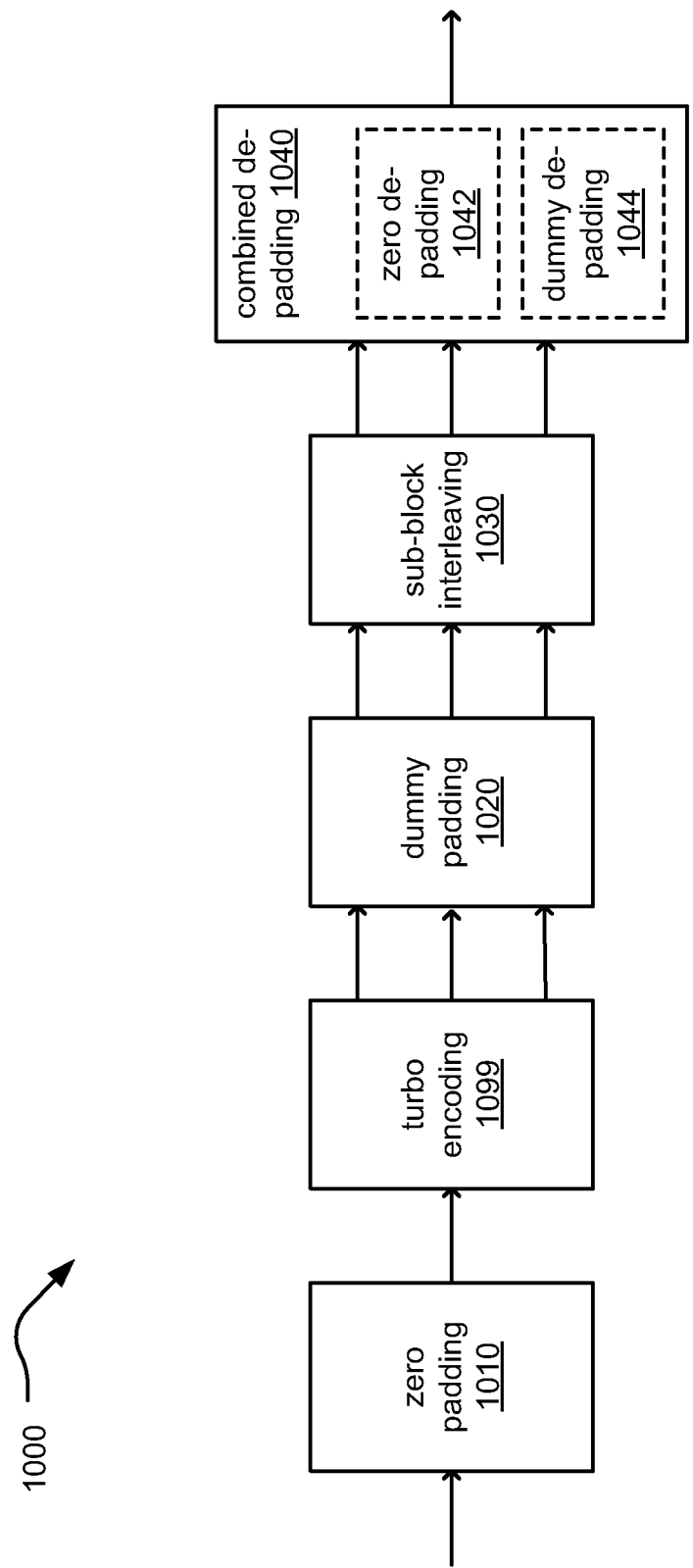
FIG. 10 illustrates an embodiment of combined turbo de-padding and rate matching de-padding.

FIG. 10 illustrates an embodiment of combined turbo de-padding and rate matching de-padding 1000. A novel means for performing combined zero bit de-padding for turbo code and dummy bits de-padding for rate matching is presented.

A zero padding module 1010 is operable to pad zero or more zero bits (e.g., no 0-valued bits or one or more 0-valued bits) to an information bit stream thereby generating a zero padded information bit stream (e.g., there may be some instances where no 0-valued bits get padded to the information bit stream, and the information bit stream is the same as the zero padded information bit stream).

Thereafter, the zero padded information bit stream is provided to a turbo encoding module 1099 that is operable encode the zero padded information bit stream thereby generating a plurality of systematic bits, a first plurality of parity bits, and a second plurality of parity bits. For example, the turbo encoding module 1099 is operable to encode in an analogous manner that the turbo encoding module 699 of the FIG. 6 is able to do.

A dummy padding module 1020 is then operable to pad zero or more dummy bits to the plurality of systematic bits, the first plurality of parity bits, and the second plurality of parity bits thereby generating a plurality of dummy padded systematic bits, a first plurality of dummy padded parity bits, and a second plurality of dummy padded parity bits (e.g., there may be some instances where no dummy bits get padded to any of these streams output from the dummy padding module 1020). In some embodiments, the dummy padding module 1020 is operable to pad dummy bits to each of the plurality of systematic bits, the first plurality of parity bits, and the second plurality of parity bits.

A sub-block interleaving ($\pi$) module 1030 is then operable to perform sub-block interleaving on at least one of the plurality of dummy padded systematic bits, the first plurality of dummy padded parity bits, and the second plurality of dummy padded parity bits thereby generating a plurality of sub-block interleaved dummy padded systematic bits, a first plurality of sub-block interleaved, dummy padded parity bits, and a second plurality of sub-block interleaved, dummy padded parity bits. A singular de-padding module 1040 is then operable to de-pad any zero padded bits and any dummy padded bits from each of the plurality of sub-block interleaved, dummy padded systematic bits, the first plurality of sub-block interleaved, dummy padded parity bits, and the second plurality of sub-block interleaved, dummy padded parity bits thereby generating an output information bit stream. For example, a singular module is then operable to perform both zero de-padding and dummy de-padding. In some embodiments, the decision-making of which bits (either only one or both of zero padded bits and dummy padded bits) within each of the plurality of sub-block interleaved, dummy padded systematic bits, the first plurality of sub-block interleaved, dummy padded parity bits, and the second plurality of sub-block interleaved, dummy padded parity bits is to be de-padded can be implemented in a variety of ways including using code (e.g., such as software, firmware, combination thereof, and/or some other means). Generally speaking, depending on which of the 3 streams (e.g., [a] the plurality of sub-block interleaved, dummy padded systematic bits, [b] the first plurality of sub-block interleaved, dummy padded parity bits, and [c] the second plurality of sub-block interleaved, dummy padded parity bits) is being processed, then in accordance with the appropriate decision-making, only the proper bits get de-padded in the combined de-padding module 1040.

The output information bit stream (e.g., output from the combined de-padding module 1040) can then undergo modulation to generate a turbo coded signal that comports with a communication channel. This can be performed in one or more of a symbol mapper, a modulator, or other processing module. The turbo coded signal may then be launched into a communication channel implemented within any of a variety of communication systems (e.g., including but not limited to those described with respect to FIG. 1).

One possible implementation of performing the combined de-padding is provided in detail below:

Let $s_0, s_1, \ldots, s_{L_0-1}, s_{L_0}, \ldots, s_{K-1}$ be the systematic (information) bit stream (where the last 4 bits come from termination bits) from turbo encoder with first $L_0$ padded 0 bits (e.g., such as provided by the zero padding module 1010).

Let $p_0^1, p_1^1, \ldots, p_{L_0-1}^1, p_{L_0}^1, \ldots, p_{K-1}^1$ be the parity 1 bit stream from the top constituent encoder of a turbo encoding module with the first $L_0$ 0 parity bits from padded 0 bits sent to encoder.

Let $p_0^2, p_1^2, \ldots, \ldots, p_{K-1}^1$ be the parity 2 bit stream from the bottom constituent encoder of a turbo encoding module, where the parity bits corresponding to the padded bits a) may not be 0 and b) may not be at beginning.

Consider sub-block interleaves for circular buffer rate matching (CBRM). Since the CBRM employs a rectangular interleave with 32 columns, the number of rows R should be the smallest integer such that $K \leq 32R$.

Let $S=32R$ and $N_D=S-K$.

Then we have $N_D<32$.

These $N_D$ dummy bits shall be padded to the three streams (e.g., the 3 streams output from a turbo encoding module).

Let used denote the padded new streams as follows:

$t_0, t_1, \ldots, t_{S-1} = d_0 \ldots d_{N_D-1}, s_0, s_1, \ldots, s_{K-1}$ $q_0^1, q_1^1, \ldots, q_{S-1}^1 = d_0 \ldots d_{N_D-1}, p_0^1, p_1^1, \ldots, p_{K-1}^1$ $q_0^2, q_1^1, \ldots, q_{S-1}^1 = d_0 \ldots d_{N_D-1}, p_0^2, p_1^2, \ldots, p_{K-1}^2$ As can be seen, the dummy bits ($d_0 \ldots d_{N_D-1}$) are padded to each of the 3 streams.

From the zero padding of turbo encoding (e.g., such as within zero padding module 1010), we know that $t_{N_D}, \ldots, t_{N_D+L_0-1}$ and $q_{N_D}^1, \ldots, q_{N_D+L_0-1}^1$ are the zero padded bits from turbo encoding, respectively.

These streams will respectively write into the rectangular matrix row by row with 32 elements in a row. Then the 32 column shall be permuted using the following permutation table (e.g., see reference [4]).

| Number of columns C | Inter-column permutation pattern <P(0), P(1), ..., P(C – 1)> |
|---|---|
| 32 | <0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> |

After the columns permutation, the stream will be read out column by column. Let the interleave ($\pi$) be such an interleave, then we can write $\pi(i) = P(\lfloor i/R \rfloor) = 32 * (i \bmod R)$ This interleave is used for the $1^{st}$ stream (e.g., the systematic stream) as well as the $2^{nd}$ stream (e.g., the parity 1 stream).

For the $3^{rd}$ stream (e.g., the parity 2 stream), the interleave 2 is constructed with the offset index $\delta$, where $\delta \geq 0$, such that $\lambda(i) = (\pi(i) + \delta) \bmod S$ With the skipping index $\sigma$ and RV (redundancy version) index r, the first output bits of CBRM should be the number $I(\sigma, r) = R(24r + \sigma)$ bit.

With all notations being ready, one implementation of the novel de-padding approach presented herein is described in accordance with CBRM as follows. Suppose N is the size of transmitted data

```
n = 0; i = I(σ,r);
While n < N
    if i < S
        skip0 = send_systematic_bits(i)     // sub - function
        i + 1 → i;
        if skip0 = 0                         // no skip(no de - pad)
            n + 1 → n;
        endif
    else
        skip1 = send_parity_bits(i)          // sub - function
        i + 1 → i;
        if skip1 = 0                         //no skip (no de - pad)
            n + 1 → n;
        endif
        if i = 3S
            i = 0;
        endif
    endif
end
```

In this embodiment, the pseudo codes of the sub-functions are as follows:

```
send_systematic_bit(i){
    if π(i) < L_0 + N_D
        skip0 = 1;              // de - pad
    else
        output t_π(i);
        skip0 = 0;
    endif
}
send_parity_bit(i){
    if k = i - S is even
        m = k / 2;
        if π(m) < L_0 + N_D
            skip1 = 1;          // de - pad
        else
            output p_π(m)^1;
            skip1 = 0;
        endif
    endif
    if k = i - S is odd
        m = (k - 1)/ 2;
        if λ(m) < N_D
            skip1 = 1;          // de - pad
        else
            output p_λ(m)^2;
            skip1 = 0;
        endif
    endif
}
```

In the instruction-laden implementation as provided above, when the variable of skip0 or skip1 is equal to 0 (e.g., skip0=0 or skip1=0), then no de-padding is performed and those particular bits are sent out (e.g., not de-padded).

When the variable of skip0 or skip1 is equal to 1 (e.g., skip0=0 or skip1=0), then de-padding is performed and those particular bits are not sent out (e.g., those bits are de-padded).

As can be seen using an instruction-laden implementation as provided above, each of the 3 output streams (e.g., systematic bits, parity 1 bits, and parity 2 bits) from a turbo encoding module undergoes appropriate de-padding of zero and/or dummy bits that have been padded thereto. This novel approach is operable to ensure that a singular module is operable to perform de-padding of both zero and dummy bits in accordance with turbo encoding.

Figure 11:
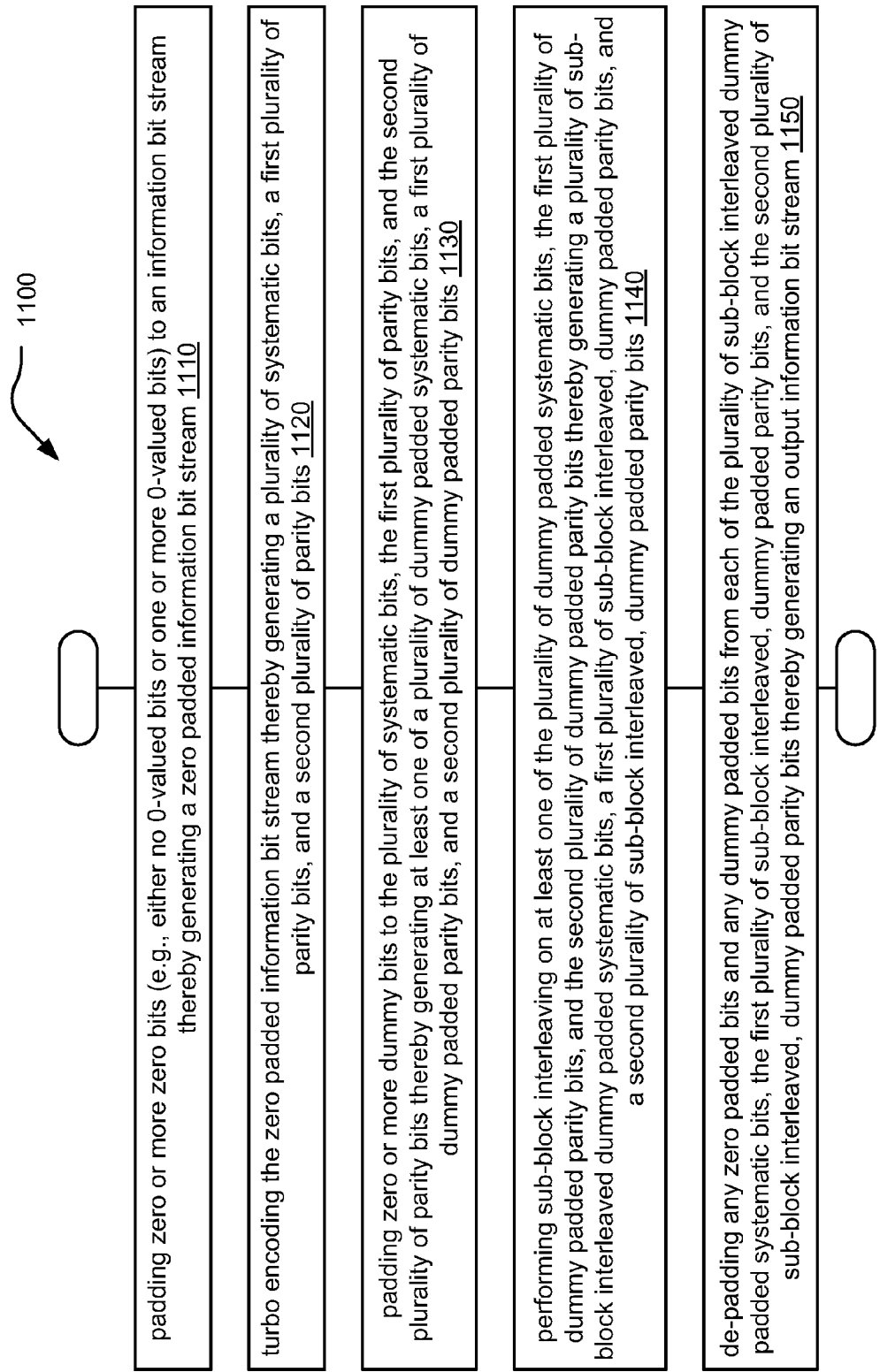
FIG. 11 illustrates an embodiment of a method for performing combined turbo de-padding and rate matching de-padding.

FIG. 11 illustrates an embodiment of a method 1100 for performing combined turbo de-padding and rate matching de-padding. As shown in a block 1110, the method 1100 involves padding zero or more zero bits (e.g., no 0-valued bits or one or more 0-valued bits) to an information bit stream thereby generating a zero padded information bit stream (e.g., there may be some instances where no 0-valued bits get padded to the information bit stream, and the information bit stream is the same as the zero padded information bit stream).

Then, as shown in a block 1120, the method 1100 involves turbo encoding the zero padded information bit stream thereby generating a plurality of systematic bits, a first plurality of parity bits, and a second plurality of parity bits.

Then, as shown in a block 1130, the method 1100 involves padding zero or more dummy bits to at least one of the plurality of systematic bits, the first plurality of parity bits, and the second plurality of parity bits thereby generating at least one of a plurality of dummy padded systematic bits, a first plurality of dummy padded parity bits, and a second plurality of dummy padded parity bits (e.g., there may be some instances where no dummy bits get padded to any of these streams output). As shown in a block 1140, the method 1100 involves performing sub-block interleaving on at least one of the plurality of dummy padded systematic bits, the first plurality of dummy padded parity bits, and the second plurality of dummy padded parity bits thereby generating a plurality of sub-block interleaved dummy padded systematic bits, a first plurality of sub-block interleaved, dummy padded parity bits, and a second plurality of sub-block interleaved, dummy padded parity bits.

Then, as shown in a block 1150, the method 1100 involves de-padding any zero padded bits and any dummy padded bits from each of the plurality of sub-block interleaved dummy padded systematic bits, the first plurality of sub-block interleaved, dummy padded parity bits, and the second plurality of sub-block interleaved, dummy padded parity bits thereby generating an output information bit stream.

In some embodiments, the method can also involve modifying the output information bit stream to a form that comports with a communication channel of the wireless communication system. After the output information bit stream has undergone any appropriate modification to comport with the communication channel, launching the modified output information bit stream into the communication channel from the communication device.

It is noted that the various modules (e.g., encoding modules, rate matching modules, padding modules, de-padding modules, combined de-padding modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol.: 1, pp: 341-345, 20-24 Jun. 2004.
[2] O. Y. Takeshita, "On maximum contention-free interleavers and permutation polynomials over integer rings," IEEE Trans. Information Theory, vol 52, No. 3, March 2006.
[3] Ericsson, Motorola, QPP interleaver parameters, 3GPP TSG RAN WG1 #47bis R1-070484.
[4] 3GPP TS 36.212 v2, "Multiplexing and Channel Coding (Release 8)," 2007.
[5] Ericsson, Motorola, Broadcom, Siemens, Samsung, "On Depadding Method for LTE Turbo Coding, R1-071807, 3GPP TSG-RAN WG1#48bis.
[6] Ericsson, "Combined Partial Depadding and Rate Matching Based on Circular Buffers," R1-073031, 3GPP TSG-RAN WG1#49bis.

What is claimed is:

1. An apparatus, comprising:
a plurality of inputs for respectively receiving a plurality of bit streams each selectively including at least one zero padded bit and at least one dummy padded bit; and
a combined de-padding module for selectively de-padding:
at least one of a first at least one zero padded bit and a first at least one dummy padded bit from a first of the plurality of bit streams, when present and based on decision making corresponding to the first of the plurality of bit streams thereby generating a first of a plurality of de-padded bit streams;
at least one of a second at least one zero padded bit and a second at least one dummy padded bit from a second of the plurality of bit streams, when present and based on decision making corresponding to the second of the plurality of bit streams thereby generating a second of the plurality of de-padded bit streams; and
combining the first of the plurality of de-padded bit streams and the second of the plurality of de-padded bit streams in accordance with generating the output information bit stream; and wherein:
a modulator for modulating the output information bit stream thereby generating a signal comporting with a communication channel; and
an output for launching the signal into the communication channel.

2. The apparatus of claim 1, further comprising:
a zero padding module for selectively padding the at least one zero padded bit, being at least one zero-valued bit, to an input information bit stream thereby generating a zero padded information bit stream;
a turbo encoder for encoding the zero padded information bit stream thereby generating a plurality of bit streams;
a dummy padding module for selectively padding at least one zero-valued bit to each of the plurality of bit streams thereby generating a plurality of dummy padded bit streams; and
a sub-block interleaving module for selectively performing sub-block interleaving on at least one of the plurality of dummy padded bit streams thereby generating the plurality of bit streams.

3. The apparatus of claim 2, wherein:
a first of the plurality of bit streams including a plurality of systematic bits
a second of the plurality of bit streams including a first plurality of parity bits; and
a third of the plurality of bit streams including a second plurality of parity bits.

4. The apparatus of claim 1, wherein:
the apparatus being a communication device operative within at least one of a satellite communication system, a wireless communication system, a wired communication system, and a fiber-optic communication system.

5. An apparatus, comprising:
at least one input for receiving at least one bit stream selectively including at least one zero padded bit and at least one dummy padded bit; and
a combined de-padding module for selectively de-padding at least one of the at least one zero padded bit and the at least one dummy padded bit, when present and based on decision making corresponding to at least one bit stream, from the at least one bit stream in accordance with generating an output information bit stream.

6. The apparatus of claim 5, further comprising:
a plurality of inputs for respectively receiving a plurality of bit streams each selectively including at least one zero padded bit and at least one dummy padded bit; and wherein:
the combined de-padding module for selectively de-padding:
 at least one of a first at least one zero padded bit and a first at least one dummy padded bit from a first of the plurality of bit streams, when present and based on decision making corresponding to the first of the plurality of bit streams thereby generating a first of a plurality of de-padded bit streams;
 at least one of a second at least one zero padded bit and a second at least one dummy padded bit from a second of the plurality of bit streams, when present and based on decision making corresponding to the second of the plurality of bit streams thereby generating a second of the plurality of de-padded bit streams; and
 combining the first of the plurality of de-padded bit streams and the second of the plurality of de-padded bit streams in accordance with generating the output information bit stream.

7. The apparatus of claim 5, further comprising:
a zero padding module for selectively padding the at least one zero padded bit, being at least one zero-valued bit, to an input information bit stream thereby generating a zero padded information bit stream;
a turbo encoder for encoding the zero padded information bit stream thereby generating a plurality of bit streams;
a dummy padding module for selectively padding at least one zero-valued bit to each of the plurality of bit streams thereby generating a plurality of dummy padded bit streams;
a sub-block interleaving module for selectively performing sub-block interleaving on at least one of the plurality of dummy padded bit streams thereby generating a plurality of sub-block interleaved bit streams; and wherein:
the combined de-padding module for selectively de-padding:
 at least one of a first at least one zero padded bit and a first at least one dummy padded bit from a first of the plurality of sub-block interleaved bit streams, when present and based on decision making corresponding to the first of the plurality of sub-block interleaved bit streams thereby generating a first of a plurality of de-padded bit streams;
 at least one of a second at least one zero padded bit and a second at least one dummy padded bit from a second of the plurality of sub-block interleaved bit streams, when present and based on decision making corresponding to the second of the plurality of sub-block interleaved bit streams thereby generating a second of the plurality of de-padded bit streams; and
 combining the first of the plurality of de-padded bit streams and the second of the plurality of de-padded bit streams in accordance with generating the output information bit stream.

8. The apparatus of claim 7, wherein:
a first of the plurality of bit streams including a plurality of systematic bits
a second of the plurality of bit streams including a first plurality of parity bits; and
a third of the plurality of bit streams including a second plurality of parity bits.

9. The apparatus of claim 7, wherein:
the sub-block interleaving module for performing first sub-block interleaving on a first of the plurality of dummy padded bit streams thereby generating a first of the plurality of sub-block interleaved bit streams; and
the sub-block interleaving module for performing second sub-block interleaving on a second of the plurality of dummy padded bit streams thereby generating a second of the plurality of sub-block interleaved bit streams.

10. The apparatus of claim 7, wherein:
the sub-block interleaving module for performing first sub-block interleaving on a first of the plurality of dummy padded bit streams thereby generating a first of the plurality of sub-block interleaved bit streams;
the sub-block interleaving module for performing the first sub-block interleaving on a second of the plurality of dummy padded bit streams thereby generating a second of the plurality of sub-block interleaved bit streams; and
the sub-block interleaving module for performing second sub-block interleaving on a third of the plurality of dummy padded bit streams thereby generating a third of the plurality of sub-block interleaved bit streams.

11. The apparatus of claim 7, wherein:
the turbo encoder for employing quadratic polynomial permutation (QPP) in accordance with encoding the zero padded information bit stream thereby generating the plurality of bit streams.

12. The apparatus of claim 7, wherein:
the sub-block interleaving module for employing circular buffer rate matching in accordance with generating the plurality of sub-block interleaved bit streams.

13. The apparatus of claim 5, further comprising:
a modulator for modulating the output information bit stream thereby generating a signal comporting with a communication channel; and
an output for launching the signal into the communication channel.

14. The apparatus of claim 5, wherein:
the apparatus being a communication device operative within at least one of a satellite communication system, a wireless communication system, a wired communication system, and a fiber-optic communication system.

15. A method for operating a communication device, the method comprising:
via at least one input, receiving at least one bit stream selectively including at least one zero padded bit and at least one dummy padded bit;
operating a combined de-padding module for selectively de-padding at least one of the at least one zero padded bit and the at least one dummy padded bit, when present and based on decision making corresponding to at least one bit stream, from the at least one bit stream in accordance with generating an output information bit stream;
modulating the output information bit stream thereby generating a signal comporting with a communication channel; and
launching the signal into the communication channel.

16. The method of claim 15, further comprising:
via a plurality of inputs, respectively receiving a plurality of bit streams each selectively including at least one zero padded bit and at least one dummy padded bit; and
operating the combined de-padding module for selectively de-padding:
at least one of a first at least one zero padded bit and a first at least one dummy padded bit from a first of the plurality of bit streams, when present and based on decision making corresponding to the first of the plurality of bit streams thereby generating a first of a plurality of de-padded bit streams;
at least one of a second at least one zero padded bit and a second at least one dummy padded bit from a second of the plurality of bit streams, when present and based on decision making corresponding to the second of the plurality of bit streams thereby generating a second of the plurality of de-padded bit streams; and
combining the first of the plurality of de-padded bit streams and the second of the plurality of de-padded bit streams in accordance with generating the output information bit stream.

17. The method of claim 15, further comprising:
operating a zero padding module for selectively padding the at least one zero padded bit, being at least one zero-valued bit, to an input information bit stream thereby generating a zero padded information bit stream;
operating a turbo encoder for encoding the zero padded information bit stream thereby generating a plurality of bit streams;
operating a dummy padding module for selectively padding at least one zero-valued bit to each of the plurality of bit streams thereby generating a plurality of dummy padded bit streams;
operating a sub-block interleaving module for selectively performing sub-block interleaving on at least one of the plurality of dummy padded bit streams thereby generating a plurality of sub-block interleaved bit streams; and
operating the combined de-padding module for selectively de-padding:
at least one of a first at least one zero padded bit and a first at least one dummy padded bit from a first of the plurality of sub-block interleaved bit streams, when present and based on decision making corresponding to the first of the plurality of sub-block interleaved bit streams thereby generating a first of a plurality of de-padded bit streams;
at least one of a second at least one zero padded bit and a second at least one dummy padded bit from a second of the plurality of sub-block interleaved bit streams, when present and based on decision making corresponding to the second of the plurality of sub-block interleaved bit streams thereby generating a second of the plurality of de-padded bit streams; and
combining the first of the plurality of de-padded bit streams and the second of the plurality of de-padded bit streams in accordance with generating the output information bit stream.

18. The method of claim 17, wherein:
a first of the plurality of bit streams including a plurality of systematic bits
a second of the plurality of bit streams including a first plurality of parity bits; and
a third of the plurality of bit streams including a second plurality of parity bits.

19. The method of claim 17, further comprising:
operating the sub-block interleaving module for performing first sub-block interleaving on a first of the plurality of dummy padded bit streams thereby generating a first of the plurality of sub-block interleaved bit streams;
operating the sub-block interleaving module for performing the first sub-block interleaving on a second of the plurality of dummy padded bit streams thereby generating a second of the plurality of sub-block interleaved bit streams; and
operating the sub-block interleaving module for performing second sub-block interleaving on a third of the plurality of dummy padded bit streams thereby generating a third of the plurality of sub-block interleaved bit streams.

20. The method of claim 15, wherein:
the communication device operative within at least one of a satellite communication system, a wireless communication system, a wired communication system, and a fiber-optic communication system.

* * * * *